(12) United States Patent
Kimock et al.

(10) Patent No.: US 8,030,219 B1
(45) Date of Patent: Oct. 4, 2011

(54) DIELECTRIC COATINGS AND USE IN CAPACITORS

(75) Inventors: Fred M. Kimock, Macungie, PA (US); Steven J. Finke, Kutztown, PA (US); Richard L. C. Wu, Beavercreek, OH (US)

(73) Assignees: Morgan Advanced Ceramics, Inc., Hayward, CA (US); K Systems Corporation, Beavercreek, OH (US)

( * ) Notice: Subject to any disclaimer, the term of this patent is extended or adjusted under 35 U.S.C. 154(b) by 458 days.

(21) Appl. No.: 11/348,751

(22) Filed: Feb. 7, 2006

Related U.S. Application Data

(60) Provisional application No. 60/650,703, filed on Feb. 7, 2005.

(51) Int. Cl.
*H01L 21/31* (2006.01)
*H01L 21/469* (2006.01)

(52) U.S. Cl. ........ 438/758; 438/778; 438/787; 438/789; 257/E21.487

(58) Field of Classification Search .................. 438/758, 438/778, 789
See application file for complete search history.

(56) References Cited

U.S. PATENT DOCUMENTS

| | | | |
|---|---|---|---|
| 4,168,330 A | 9/1979 | Kaganowicz | |
| 4,490,229 A | 12/1984 | Mirtich et al. | |
| 5,508,368 A * | 4/1996 | Knapp et al. | 427/534 |
| 5,618,619 A * | 4/1997 | Petrmichl et al. | 428/334 |
| 5,844,770 A | 12/1998 | Fries-Carr et al. | |
| 5,888,593 A * | 3/1999 | Petrmichl et al. | 427/563 |
| 5,973,447 A * | 10/1999 | Mahoney et al. | 313/359.1 |
| RE37,294 E | 7/2001 | Knapp et al. | |
| 6,949,392 B2 * | 9/2005 | Gill et al. | 438/31 |
| 2002/0032073 A1* | 3/2002 | Rogers et al. | 473/324 |
| 2005/0194619 A1* | 9/2005 | Edelstein et al. | 257/232 |

* cited by examiner

*Primary Examiner* — Angel Roman
(74) *Attorney, Agent, or Firm* — Dean W. Russell; Kristin M. Crall; Kilpatrick Townsend & Stockton LLP

(57) ABSTRACT

A coated substrate product is described comprising a substrate and a dielectric coating material comprising carbon, hydrogen, silicon, and oxygen. According to the method, the substrate is processed by plasma cleaning the surface and then depositing a dielectric coating by a suitable plasma process. The coating may contain one or more layers. The substrate may be a rigid material or a thin film or foil. The coated products of this invention have superior dielectric material properties and utility as substrates for the manufacture of rolled or parallel plate capacitors with high energy densities.

12 Claims, 3 Drawing Sheets

Clearing of 5000Å Dielectric on 6μm PET 50Å with 50Å Top Electrode No RSO

DIELECTRIC COATINGS AND USE IN CAPACITORS

This application claims benefit to U.S. Provisional Application Ser. No. 60/650,703 filed Feb. 7, 2005, the entire contents of which are incorporated by reference.

STATEMENT REGARDING FEDERALLY SPONSORED RESEARCH OR DEVELOPMENT

This invention was made with government support under Contract No. F33615-03-C-2351 awarded by the United States Department of the Air Force. The government has certain rights in the invention.

BACKGROUND OF THE INVENTION

1. Field of the Invention

This invention relates generally to a material and the process for depositing coatings with superior dielectric properties to be used as dielectrics in rolled or parallel plate capacitors. More particularly, the invention relates to a process for applying coatings to films and foils or parallel plates which can be energized to form capacitors for energy storage.

2. Description of Related Art

Rolled capacitors are typically formed by alternating layers of metal (the electrodes) with layers of polymer dielectrics in a rolled geometry. Parallel-plate capacitors can be manufactured in the same way by alternating layers of rigid electrodes and polymer or ceramic dielectrics. Polymer dielectrics have limitations in temperature stability, dielectric strength, and dissipation factors. For a given voltage rating, the required polymer thickness can be significant, typically greater than 2 micron. Ceramic dielectrics often suffer from low dielectric strengths.

Existing methods for using coatings on metal electrodes as the dielectrics in rolled and parallel-plate capacitors include, e.g., traditional diamond-like carbon films (DLC's), which typically comprise amorphous carbon films which may or may not contain hydrogen, and typically exhibit a mixture of sp3 (diamond-type) and sp2 (graphite-type) chemical bonds, which have been proposed as a dielectric coating material. The resultant deposition rates are often very slow, and hence, of no commercial value for this application.

Plasma deposition methods for the application of dielectric coatings suffer from one or more of the following deficiencies and shortcomings:

(1) Difficulty in pre-cleaning of substrates prior to deposition;
(2) Poor adhesion of the dielectric layer;
(3) High permeation of the coatings by water vapor and oxygen and subsequent degradation of dielectric properties;
(4) Fabrication of defect-laden or permeable, low density coatings;
(5) Poor control of coating properties during a deposition run;
(6) Poor coating thickness control and reproducibility of thickness;
(7) Coating stress is sufficient to cause wrinkling of the foil or film substrate or electrode;
(8) Poor control of coating uniformity along a long length of substrate;
(9) Inability to scale-up the deposition process for mass production; and
(10) Brittle coatings which crack or craze during rolling processes.

Ion beam etching and deposition of many materials, including webs and foils is known. Surface modification processes or thin film deposition processes by ion beams are routinely used for food packaging to decrease permeability to oxygen and lengthen shelf lives of products.

Unfortunately, due to the high compressive stress it is difficult to deposit traditional DLCs on soft plastics and films and foils such as polycarbonate or polyester to thicknesses greater than 0.1 microns without the formation of stress cracks or wrinkling of the substrate. DLC is therefore unsuitable as a thick (i.e. greater than 0.1 micron thick coating) on such substrates.

The following documents illustrate existing coating processes and dielectric coatings:

Kaganowicz, U.S. Pat. No. 4,168,330, describes a process for depositing a silicon dioxide layer on a substrate by activating a mixture of cyclic siloxanes and oxygen "around the substrate by means of a glow discharge." It is taught that this plasma polymerization process was designed for depositing thin dielectric layers on audio/video discs.

S. Fries-Carr, R. L. C. Wu and P. B. Kosel, U.S. Pat. No. 5,844,770, describes the use of dielectric coated materials in rolled capacitors B. Knapp, F. Kimock, R. Petrmichl, N. Galvin, U.S. Pat. No. RE37294 describe the deposition of abrasion-resistant coatings using ion beam deposition processes.

Petrmichl, R., Knapp, B., Kimock, F., Daniels, B., U.S. Pat. No. 5,618,619 describes the material and composition of a Highly Abrasion Resistant Flexible Coatings for Soft Substrates.

However, none of these documents disclose a method for producing a dielectric coated substrate that has all of the properties necessary or desirable for incorporation into a rolled capacitor, including high dielectric constant, high dielectric strength, high breakdown voltage, low dissipation factor, and is highly adherent and able to be rolled. Thus, there remains a need in the art for a method for producing such a dielectric-coated substrate, as well as for the substrate itself and capacitors produced therefrom.

SUMMARY OF THE INVENTION

The invention provides a material and an improved method for deposition of a dielectric coating onto substrates. More particularly, this invention provides a method for producing a dielectric-material coating on the surface of a film, foil, or solid substrate which is highly adherent, and exhibits high dielectric strength, high dielectric constant, and low dissipation factor. Still more particularly, this invention provides a low cost and efficient process for mass-producing dielectric coatings on long lengths of substrates. The method is especially useful for applying dielectrics to metal foils and metallized polymer films at high deposition rates, allowing them to be formed into rolled capacitors.

The product of the invention contains an amorphous, conformal, dielectric coating comprising the elements of C, Si, H, and O. The coatings may also contain N. The coatings are deposited from precursor gases containing at least the elements of which the coating is comprised, in the presence of a plasma. The dielectric properties, stress, and chemistry of the coatings can be tailored to suit the needs of the particular substrate and performance requirements of the coated product. These properties make the coatings of the present invention ideally suited to film and foil-type substrates for rolled capacitors.

One process method for deposition of these coatings uses an ion beam source which operates with precursor gases comprising at least one of the following combinations of elements selected from the group consisting of Si and C; Si, C and H; Si and N; Si, N and H; Si and O; Si, O and H; Si, O and N; Si, C, H and O; Si, C, O and N; and Si, C, H, O and N. The process of the present invention is particularly well-suited to the manufacture of dielectric coatings with tailored hardness, stress, and chemistry. These properties make the coatings of the present invention ideally suited to application to plastic substrates, such as polymer films and metallized polymer films. The resulting coatings are sufficiently adherent and flexible to allow the coated substrates to be formed into a roll capacitor. Coatings which have properties resembling silicon carbide, silicon nitride, silicon dioxide, and hydrogenated and oxygenated forms of these materials can also be made by this process.

In the method of the invention, a chemically cleaned substrate (i.e., a substrate that has been cleaned to remove unwanted materials and other contaminants) is inserted into a vacuum chamber; which is pumped down to evacuate all or most of the air (e.g., to a vacuum of around $10^{-3}$ torr). The material is moved past one or more plasma ion sources which provide one or more beams of energetic ions to sputter-etch the substrate surface and assist in the removal of residual contaminants, such as residual hydrocarbons and surface oxides, and which are believed to activate the substrate surface to subsequent reaction with the deposited coating.

After the substrate surface has been etched, a dielectric coating comprising C, H, Si, and O (and optionally N) is deposited by using a deposition flux containing C, H, Si, and O (and optionally N) onto the surface of a fixed substrate or moving web of film or foil. The deposition flux is created by providing gaseous precursor compounds in the presence of a plasma, which can be effectively generated by an ion beam. The deposition conditions and substrate movement speed are adjusted to produce the desired properties in and thickness of the coating. This (desirably plasma ion beam-) deposited coating may contain one or more layers. Once the desired thickness of the coating has been achieved, the deposition process on the substrates is terminated, the vacuum chamber pressure is increased to atmospheric pressure, and the coated substrates, having superior dielectric properties, are removed from the vacuum chamber.

The coatings of the present invention may be capped with a top or outer layer of another material to provide chemical resistance, barrier properties and reduced surface friction.

In one embodiment, therefore, the invention relates to a method for depositing onto a substrate a dielectric coating material containing one or more of C, H, Si, and O, which comprises:

(a) mounting a substrate in a deposition vacuum chamber and placing the chamber under vacuum;

(b) etching the surface of the substrate with energetic ions, chemically reactive species, or a combination of these, thereby providing a cleaned, activated surface;

(c) depositing onto the cleaned activated surface an layer of dielectric material by exposing the substrate to a deposition flux of organo-silicon or silane-based precursors which could include organosiloxanes, silanes, organosilazanes or mixtures thereof and also may include oxygen in the presence of a plasma; and (d) recovering the substrate coated with a first dielectric layer.

In another embodiment, the invention relates to the coated substrate produced by this method. More particularly, the invention relates to a dielectric-coated substrate, comprising a first layer of dielectric coating material comprising carbon, hydrogen, silicon, and oxygen. Desirably, this dielectric coating material has a dielectric strength ranging from about 200 V/μm to about 2400 V/μm and higher. Dielectric coating materials having dielectric strengths greater than about 600 V/μm are particularly suitable. The dielectric coating material can include those having dissipation factors less than about 2%.

In yet another embodiment, the invention relates to capacitors comprising the coated substrate described herein.

DETAILED DESCRIPTION OF SPECIFIC EMBODIMENTS

Figure 1:
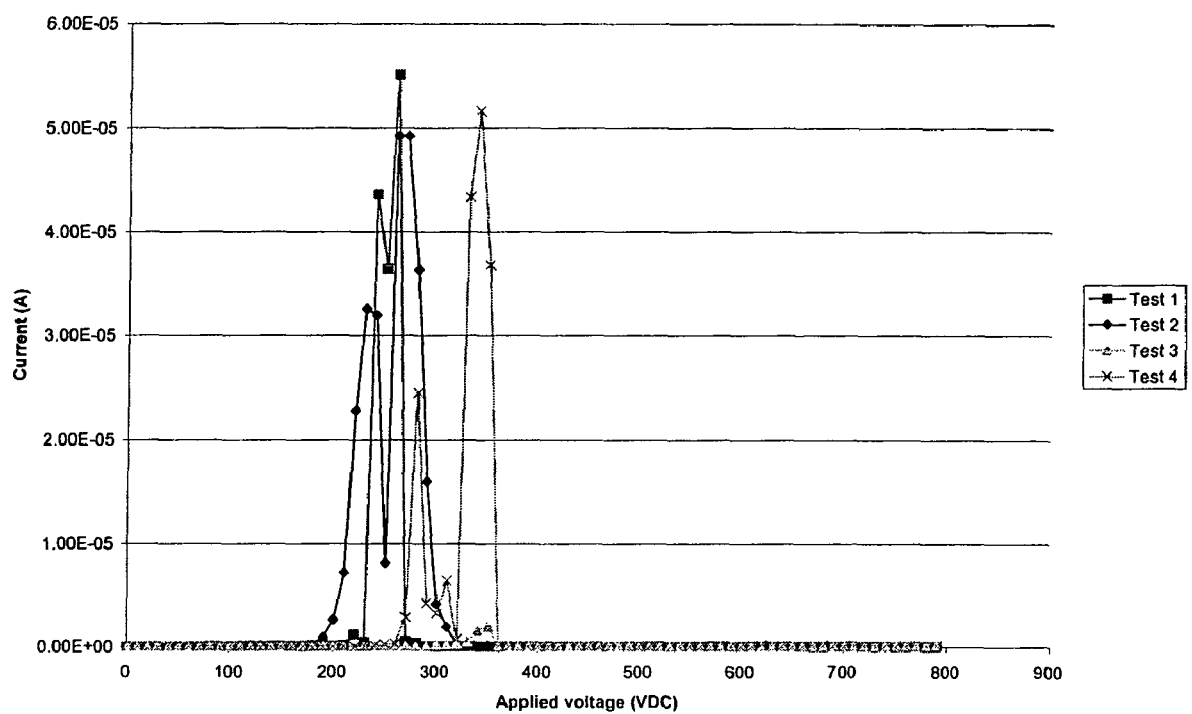
FIG. 1 is a graph showing breakdown voltage test results for a coated substrate produced according to one embodiment of this invention.

The product of the present invention substantially reduces or eliminates the disadvantages and shortcomings associated with the prior art techniques by providing coatings with high dielectric strength, low dissipation factor, high dielectric constant coating, and very adherent coating by a manufacturing process which can be readily scaleable to long lengths of materials suitable for device fabrication.

In a particular embodiment of this invention, mixtures of one or more organosiloxane, organosilane, or organosilazane precursor gases and oxygen are introduced into the vacuum chamber, and deposition conditions are adjusted so that coatings with the combination of the following electrical physical properties are produced, which combination of properties are remarkable when compared to prior art coatings. Precursor gases comprising hexamethyldisiloxane, tetramethylcyclotetrasiloxane, octamethylcyclotetrasiloxane, or mixtures thereof have been found to be suitable in this regard.

These precursor gases are provided in the presence of a plasma, which may be generated by an ion beam. A gridless ion source, such as an End Hall ion source, Hall current ion source, or closed-drift ion source is suitable.

A particularly suitable method of demonstrating these principles is the use of a gridless, closed-drift DIAMONEX® CD SOURCE (Morgan Advanced Ceramics, Inc.) for plasma ion beam processing in conjunction with a web-handling system that is capable of continuously moving a film or foil past the ion source while providing back-side cooling to the substrate. The dielectric material may also be produced by use of RF plasma processes by traditional parallel plate plasma reactors.

Important characteristics of the process include:
1. The ability to keep the internal compressive stress of the coating low coupled with excellent adhesion allows the deposition of thick coatings on a variety of substrate materials and thicknesses. It is necessary to have coating thicknesses greater than 0.1 micron in order to obtain sufficient dielectric breakdown voltages.
2. Excellent adhesion of the dielectric layer(s) is produced by generating an atomically clean surface prior to the deposition of the coating. The coating is preferably deposited immediately upon completion of the etching step to achieve maximum adhesion to the substrate. Deposition of the coating layer(s) immediately upon completion of the etching step minimizes the possibility for recontamination of the etched surface with vacuum chamber residual gases or other contaminants.

3. Overcoming the difficulties in obtaining an atomically clean surface by sputter-etching the substrates using an ion beam of controlled current and energy. It has been found that the control of ion beam current and beam energy to within 1% is consistently achieved which results in a highly repeatable and predictable rate of removal of surface contaminant layers. In addition, the ion beam sputter-etching process is conducted in high vacuum conditions, such that oxidation or contamination of the surface with residual gases in the coating system is negligible. Finally, the apparatus geometry can be configured such that the majority of sputtered contaminants deposit on the vacuum chamber walls, and they do not re-deposit onto the surface of the part as it is being sputter-etched.

4. Producing excellent adhesion of the dielectric ion beam deposited layer(s) by generating an atomically clean surface prior to the deposition of the coating. For most applications, the deposited protective layer contains silicon, however, multiple applications of different chemistries can be used to form multiple different layers on the substrate. For applications in which the topmost layer of the coating does not contain silicon, adhesion can be enhanced via the use of silicon-containing adhesion-promoting interlayers between the top coating, e.g. DLC, and the substrate. In either case, the ion beam deposited layer is preferably deposited immediately upon completion of the ion beam sputter-etching step to achieve maximum adhesion to the substrate. Deposition of the coating layer(s) immediately upon completion of the ion beam sputter-etching step minimizes the possibility for re-contamination of the sputter-etched surface with vacuum chamber residual gases or other contaminants. The silicon-containing layers include a variety of amorphous materials, such as silicon oxide, silicon nitride, silicon oxy-nitride, silicon carbide, silicon oxy-carbide, silicon carbonitride, the so-called silicon-doped DLC, mixtures thereof and chemical combinations thereof. Each of the silicon-containing interlayers may contain hydrogen.

5. Obtaining minimal batch-to-batch or "along the length" variation in the properties of the coatings. This is the case because process parameters such as ion energy, ion current density, gas flow rate, and deposition chamber pressure are largely decoupled in the ion beam deposition method of the present invention, and because each of these process parameters can be accurately controlled and reproduced to a high degree of certainty, often to within 1%. In addition, the process endpoint coating thickness is easily defined and reproduced.

6. Being readily scaled-up to accommodate mass production because large scale ion beam sources are commercially available. For example, commercially available ion beam sources in either circular or linear geometries have been used for sputter etching, surface modification, or deposition of coatings over wide films and foils.

It is understood that the process of the present invention can be carried out in a batch-type vacuum deposition system with an incorporated web-handling system, in which the main vacuum chamber is evacuated and vented to atmosphere after processing each roll of substrate material or inline processing vacuum deposition chambers, in which web or foil moves constantly from atmosphere, through differential pumping zones and slit valves, into the deposition chamber, back through differential pumping zones, and returned to atmospheric pressure. The invention is therefore suitable for depositing coatings to a wide variety of substrate materials, such as polymers, metals, glasses, ceramics, or combinations of these. For making the resulting coated substrates into capacitors, a metallized polymer film, such as mylar, is particularly suitable.

Additionally, to improve the deposition rate and throughput of the coating machine, multiple ion sources can be utilized and operated simultaneously. Operation of the ion sources can be sequenced for the case in which different coating materials are deposited from each ion source. As described in U.S. Pat. No. 4,490,229, an additional ion source can be used to co-bombard the substrates during coating deposition to alter the film properties.

In a particular method for depositing the coatings of the present invention, either multiple ion sources or multiple passes of the material past a single ion source are used to sequentially process a long length of substrate material.

In the first step of the process, the substrate material is inserted into a vacuum chamber, and the air in the chamber is evacuated. For the case of ion beam deposition, typically, the vacuum chamber is evacuated to a pressure of $1.0 \times 10^{-5}$ Torr or less to ensure removal of water vapor and other contaminants from the vacuum system. However, the required level of vacuum which must be attained prior to initiating the next step must be determined by experimentation. The exact level of vacuum is dependent upon the nature of the substrate material, the sputter-etching rate, the constituents present in the vacuum chamber residual gas, and the details of the coating process. It is not desirable to evacuate to lower pressures than necessary, as this slows down the process and reduces the throughput of the coating system.

In the second step of the process, the substrate surface is bombarded by energetic ions or exposed to reactive species to remove residual contaminants, e.g. any residual hydrocarbons, surface oxides and other unwanted materials not removed in the first step, and to activate the surface. This etching of the substrate surface is required to achieve high adhesion between the substrate surface and the coating layer(s). The etching can be carried out with inert gases such as argon, krypton, and xenon. Additionally, hydrogen or oxygen may be added to the inert gases or used independently to etch and activate the surface. Ion energies as high as 2000 eV can be used, but ion energies less than 500 eV result in the least amount of atomic scale damage to the substrate.

Immediately after the substrate surface has been etched, a coating layer is deposited on the substrate by a deposition flux which includes energetic ions and contains the elements C, Si, H, O, and optionally N. The deposition flux is generated by introducing precursor gases containing the elements C, Si, H, O, and optionally N, into a plasma. These precursor gases may be blended with other inert gases, e.g. argon. The precursor gases undergo "activation" in the plasma or in the ion beam itself. Examples of "activation" include, but are not limited to simple electronic excitation, ionization, chemical reaction with other species, ions and neutrals, which may be vibrationally or electronically excited, and decomposition into simpler ionic or neutral species which may be vibrationally or electronically excited. Ions are extracted from the plasma or ion source and strike the surface to be coated with energies from about 10 to about 1500 eV. The ion impact energy depends on the electric field between the point of origin of the ion and the sample, and the loss of energy due to collisions which occur between the ion and other ionic or neutral species prior to the impingement of the ion onto the substrate. Other activated species may also condense on the substrate surface. Neutral species will strike the surface with a variety of energies, from thermal energy to hundreds of eV, depending on the origin of the neutral species. This highly energetic deposition process produces highly adherent, very dense and hard coatings on the substrate surface. The density, hardness and other properties of the coating are all very dependent on the energetics of the deposition process as well as the precursor gases used.

In the ion beam process, the primary control parameters are the precursor gas flow, the oxygen gas flow, the pumping speed, and the beam energy and current density. The useful range of the latter is, however, limited for temperature sensitive substrates, such as polymers. Other process parameters that affect the coating properties are the total flow rate, speed of the material as it passes the ion source(s) and the presence of external magnetic fields.

The following describes several different forms of the plasma ion beam deposited, dielectric coating. In the simplest case, the deposition process conditions are not changed between passes and a single deposition pass is used, resulting in a single layer coating. The thickness of this layer can be from about 0.1 micron (1000 Angstroms) to about 3 microns (30,000 Angstroms), depending on the capacitor design required by the application. Generally, thicker coatings provide higher breakdown voltages.

A variety of precursor gases and reactive gases for the deposition of dielectric material layers have been investigated. Some examples of the generalized results are shown in TABLE 1

TABLE 1

| Dielectric Precursor | Formula | Reactive gas | Resulting Film | General Result |
|---|---|---|---|---|
| TMS | SiC4H12 | | SixCyHz | electrical data erratic, reasonable deposition rates |
| Methane | CH4 | | CyHz | Poor adhesion, low deposition rate |
| Methane | CH4 | | CyHz | High BDV but very low deposition rate (35-400 A/min) |
| Methane | CH4 | H2 | CyHz+ | minimal improvement by H2 addition, low deposition rates |
| TMS | SiC4H12 | O2 | SixOyCzHa | BDV >600 V/um |
| TMS | SiC4H12 | H2 | SixOyCzHa+ | Inconsistent properties, low BDV |
| Cyclohexane | C6H12 | | CyHz | Rate higher than methane but inconsistent, low BDV |
| OMCTS | Si4O4C8H24 | O2 | SixOyCzHa | Very high rates, high BDV (>700 V/um) |

Deposition rate is an important factor in the commercial viability of the process. Traditional DLC's typically exhibit very low deposition rates which are insufficient for production of sufficient volumes of coated substrates for capacitor manufacturing. Examples of typical deposition rates achieved for these feed gases and dielectric types are: approximately 70 Angstroms/min for methane based DLC materials, approximately 500-750 Angstroms/min for tetramethylsilane-based Si-DLC materials, approximately 580 Angstroms/min for cyclohexane-based DLC materials. The processes and chemistries used in this invention exhibit much higher deposition rates, which enable the efficient production of wound capacitors. For example, a typical deposition rate for the non-DLC dielectric material of the present invention deposited from an octamethylcyclotetrasiloxane (OMCTS)/oxygen plasma ion beam process can in the range of 10,000 to 20,000 Angstroms/min. Deposition rates ranging between about 50 and about 5000 Angstrom/sec, more particularly between about 100 and about 5000 Angstrom/sec, can thus be obtained using the process of the invention.

Another embodiment of the invention is applicable in situations where the dielectric layer does not adhere well to the substrate. In this situation, it is desirable to use a first adhesion-promoting layer or interlayer. Such a layer may utilize different precursor gases or different deposition conditions in order to enhance chemical bonding of the dielectric layer to the substrate, or to reduce film stress to enhance adhesion to the substrate. Therefore, the first layer must adhere well to the substrate and the subsequent and the dielectric layer must adhere well to the first layer. For this situation, a thin (less than 500 Angstroms) adhesion promoting layer is typically used with a thick (about 1000 Angstroms to about 3 microns) dielectric outer layer on top. A final layer of a different material may also be applied on top of the dielectric to enhance the resistance of the dielectric to degradation due to exposure to air, humidity, or other ambients during the storage or processing of the material or assembly or storage of the finished capacitor.

Examples of suitable organo-silicon compound precursors include silanes, organosiloxanes, or organosilazanes. Examples include: hexamethyldisiloxane, hexamethyldisilizane, tetramethylcyclotetrasiloxane, tetraethoxysilane, and octamethylcyclotetrasiloxane, tetramethylsilane, and mixtures thereof. Larger organo-silicon molecules such as hexamethyldisiloxane, hexamethyldisilizane, tetramethylcyclotetrasiloxane and octamethylcyclotetrasiloxane are preferred due to the higher deposition rates that are achieved with these precursors. In a particular embodiment, these silane, siloxane, and silazane precursor gases can be mixed with oxygen and the plasma or ion beam conditions are adjusted to achieve the coating materials of the present invention. However, organo-silicon compounds containing covalently bonded oxygen can be used, which will decrease or eliminate the need for addmixed oxygen.

Typical chemical compositions of the dielectric coatings produced by this process exhibit significant concentrations of the elements of carbon, hydrogen, silicon, and oxygen, and potentially nitrogen. An example of composition ranges for dielectrics produced by OMCTS/oxygen chemistries were measured to be in the range of 15-70 atomic % oxygen, more particularly 20-35 atomic % oxygen; 0-40 atomic % hydrogen, more particularly 5-30 atomic % hydrogen, even more particularly 20-30 atomic % hydrogen; 0-40 atomic % carbon, more particularly 5-37 atomic % carbon, even more particularly 20-37 atomic % carbon; and 10-35 atomic % silicon, more particularly 15-25 atomic % silicon. A small amount of argon, i.e. up to 2%, may also be present in the dielectric coating. The coatings deposited by this technique are typically completely amorphous with low pinhole densities and surface roughnesses that match the original substrate. Chemical bonding is also present between the atoms of the coating which differentiates this material from doped material or implanted or imbedded elements in a base material.

Electrical property measurements of the resulting film show dielectric strengths generally ranging between about 200 V/µm and about 2400 V/µm. Dielectric strengths greater than about 600 V/µm, more particularly greater than about 800 V/µm are obtainable. Dissipation factors <2% and more typically below 1%, are also obtained by the invention.

When rolled capacitors are manufactured using coated metal foils or metallized polymer films (e.g., films or foils having an exposed metal margin) produced by the method of the invention, several factors become important in order to realize high dielectric strengths in working capacitors. These factors include the surface roughness of the substrate, the metallization thickness of the electrode under the dielectric coating, and the dielectric constant of the gap between rolled layers of the dielectric.

The surface roughness becomes important as the dielectric layer thicknesses are decreased below 1 micron. Generally, the roughness must be small with respect to the dielectric thickness. As an example, for dielectric coating thicknesses of 0.5 micron, the maximum surface roughness (Rmax) should be below about 0.2 micron.

In order to realize the full dielectric strength of these materials, defects in the coating and on the substrate must be electrically "cleared." Clearing is the isolation of defects by the evaporation of the metallized electrode in the vicinity of the defect, usually by high instantaneous electrical currents. It has been found that, in order to achieve high dielectric strengths, very thin metallization, i.e. less than 100 Angstroms, and more preferably, less than 50 Angstroms, must be used as the electrode. This metallization can also be characterized in terms of resistivity in units of ohms/square. Preferred metallization resistivities for this invention, prior to the ion precleaning process which removes some metallization, are above about 10 ohms/square, and more preferably, greater than 20 ohms/square. Optimum metallization allows the clearing to occur easily, yet allows the remaining metallization to remain capable of carrying sufficient current for capacitor charging and discharging. The substrate can be coated on a single side, or on both sides thereof.

This clearing effect is typically possible only with the use of metallized polymer films as the substrates for rolled capacitors since metal foils require too much current flow in order to "clear". Rolled capacitors of this type require a minimum of two films rolled together with exposed metallization at each "end" of the roll for the two electrodes. Additional combinations of layers may be used which comprise single-side or double-side metallized polymer films with single-side or double-side coatings of dielectrics.

The dielectric constant of the gap between layers is a significant factor in determining the voltage breakdown characteristics of rolled or parallel plate capacitors. Air exhibits a very low dielectric stress. As a result, if air is present between the coated metallized film and the top electrode, the air gap may break down electrically before other layers in the material. This breakdown can damage the dielectric that is in close proximity, and cause a short in the capacitor. For this reason, it is well known that many high energy density capacitors are constructed such that the air in the gap is replaced with oils of various types such as silicone oil or rape seed oil (RSO). The higher dielectric constant of these oils increases the minimum breakdown voltage of the rolled or parallel plate capacitor. It has been found that another viable approach is to eliminate the air gap completely by metallizing the top surface of the dielectric, as has been done herein, and described in Example A.

The examples which follow illustrate the superior performance of the method of this invention and the products produced thereby. The examples are for illustrative purposes only and are not meant to limit the scope of the claims in any way.

Example A

In this example, several samples of silicon wafer, capacitor-grade aluminum foil, and aluminized silicon wafers (wafer segments onto which a thin layer of aluminum was evaporated) were mounted into a vacuum deposition system. The vacuum chamber was then evacuated to a pressure less than $5 \times 10^{-3}$ Torr. The substrates were pre-cleaned using an argon ion beam generated from a Hall-current closed-drift ion source of the type disclosed in U.S. Pat. No. 5,973,447, the entire contents of which are incorporated herein by reference (DIAMONEX "CD SOURCE") with a nominal 3.5-inch diameter anode channel at a throw distance of approximately 7 inches. The beam conditions for the argon pre-clean were 40 sccm argon flow, 1-minute etch with no sample motion, 8 amps of anode current, and 90 V anode-to-ground voltage. An interlayer was then deposited which consisted of 25 sccm of tetramethylsilane (TMS) injected into the argon plasma of the CD SOURCE for one minute at 8 A anode current and 60 V anode-to-ground voltage. The dielectric layer was then deposited using octamethylcyclotetrasiloxane (OMCTS) and oxygen. The flow rate of OMCTS was the equivalent of 10 g/hr of water, oxygen flow rate through the ion source was 20 sccm, and 30 sccm of argon was used in the ion source, and the beam conditions were 6 A anode current and 60 V anode-to-ground voltage. The deposition lasted 1.5 minutes.

The resulting dielectric coating was measured to be 0.473 micron thick, resulting in a static deposition rate of 0.315 micron/minute or 50 Angstroms/second.

The electrical characteristics of the composite coating were measured by evaporating small "dots" of known area of aluminum metallization which acted as a top electrode. The metallization under the dielectric acted as the "bottom electrode". Increasing voltage was applied across the top and bottom electrodes and the current flow and capacitance was measured. The electrical characteristics were as follows:
Breakdown volts (aluminum foil samples): 303V average
Dielectric strength (Al foil): 640 V/micron
Dissipation factor (Al foil, average): $3.5 \times 10^{-3}$
Coating resistivity (Al foil, average): $7.76 \times 10^{15}$ ohm-cm
Dielectric constant (Al foil, average): 2.38

Example B

In this example, several samples of silicon wafer, capacitor-grade aluminum foil, and aluminized silicon wafers (wafer segments onto which a thin layer of aluminum was evaporated) were mounted into a vacuum deposition system. The vacuum chamber was then evacuated to a pressure less than $5 \times 10^{-3}$ Torr. The substrates were pre-cleaned using an argon ion beam and a 3.5-inch CD SOURCE as described in Example A at a throw distance of approximately 7 inches. The beam conditions for the argon pre-clean were 40 sccm argon flow, 1-minute etch with no sample motion, 8 amps of anode current, and 90 V anode-to-ground voltage. An interlayer was then deposited which consisted of 25 sccm of TMS injected into the argon plasma of the CD SOURCE for one minute at 8 A anode current and 60 V anode-to-ground voltage. The dielectric layer was then deposited using OMCTS and oxygen. The flow rate of OMCTS was the equivalent of 5 g/hr of water, oxygen flow rate through the ion source was 200 sccm, 30 sccm or argon were used in the ion source, and the beam conditions were 6 A anode current and 100 V anode-to-ground voltage. The deposition lasted 1.0 minutes. The resulting dielectric coating was measured to be 0.595 micron thick, resulting in a static deposition rate of 0.595 micron/min or 100 Angstroms/second.

The electrical characteristics of the composite coating were measured as follows:
Breakdown volts (aluminum foil samples): 316V average
Dielectric strength (Al foil): 531 V/micron
Dissipation factor (Al foil, average): $5.1 \times 10^{-3}$
Coating resistivity (Al foil, average): $5.00 \times 10^{15}$ ohm-cm
Dielectric constant (Al foil, average): 4.83

The conditions of example B were repeated except that the anode-to-ground voltage was set to 120 Volts. The chemical composition of the resulting dielectric coating was measured to be carbon: 23.5 atomic %, hydrogen: 22.0 atomic %, oxygen: 34.4 atomic %, silicon: 20.0 atomic %, argon: 0.10 atomic %. The surface morphology of this sample was analyzed by Atomic Force Microscopy (AFM) which showed the coating to be totally amorphous without pinholes, and with a surface roughness (Ra) of 250 Angstroms. Analysis of this sample by infrared spectroscopy showed evidence of a variety of chemical bonds including Si—O, O—Si—O, C—H, C—C, and C=C in the dielectric material.

Example C

In this example, a roll of aluminum-metallized Q83 25-micron thick polymer film with resistivity of <1 ohm-square was mounted in a vacuum web-handling system (WHS, CHA Mark 50). The web was fed through tension rollers and around a water-cooled drum and then to a take-up spool. The vacuum chamber was then evacuated to a pressure less than $5 \times 10^{-3}$ Torr. The film material was moved in front of the ion source once for an ion preclean process using an argon ion beam and a 3.5-inch CD SOURCE at a throw distance of approximately 7 inches. The beam conditions for the argon preclean pass were 40 sccm argon flow, 6 amps of anode current, and 80 V anode-to-ground voltage. The drum speed was set to 2.0 feet per minute (fpm). No interlayer was used prior to the deposition of the dielectric layer. The dielectric layer was then deposited on the reverse pass of the web-handling system using OMCTS and oxygen. The flow rate of OMCTS was 0.1 g/min equivalent of tetraethoxysilane (TEOS), oxygen flow rate through the ion source was 30 sccm, and 20 sccm argon were used in the ion source, and the beam conditions were 6 A anode current and 90 V anode-to-ground voltage. A total of 25 feet of dielectric material was deposited onto the polymer film during a continuous coating pass. The drum speed for the dielectric deposition step was set to 0.1 fpm. The resulting dielectric coating thickness was estimated to be about 1 micron, based on previous similar deposition runs.

The electrical characteristics of the composite coating were measured as follows:
Breakdown volts: 293V average
Dielectric strength: 262 V/micron
Dissipation factor: $4.7 \times 10^{-3}$
Coating resistivity: $2.93 \times 10^{15}$ ohm-cm
Dielectric constant: 3.86

The dielectric deposition conditions of example C were repeated in another experiment in which an interlayer was used to improve adhesion to the substrate. The chemical composition of the dielectric layer was measured to be carbon: 26.5 atomic %, hydrogen: 25.0 atomic %, oxygen: 29.0 atomic %, silicon: 19.5 atomic %.

It was determined that the measured dielectric strength of this material was decreased due to the surface roughness of the material and the relative thickness of the aluminum metallization on the Q83 polymer film.

Example D

In this example, a roll of aluminum-metallized 12-micron thick polyester polymer film with metallization resistivity of 3 ohm-square thick, was mounted in the vacuum web-handling system of Example C. The chamber was then evacuated and the polyester film was argon ion beam precleaned, and a dielectric layer was deposited according to Example C, with the only difference being that the anode-to-ground voltage was 92 Volts. A total of 30 feet of polyester film was coated with the dielectric material during a continuous coating pass. The resulting dielectric coating thickness was estimated to be about 1 micron thick based on previous similar deposition runs.

The breakdown voltage and dielectric strength were evaluated using a single copper electrode (1.5 square inches area) that was placed on top of the dielectric. A high voltage power supply was attached to this copper block and also to an uncoated margin on the film material, which left a portion of the aluminum metallization exposed. The power supply voltage was then increased and the current was monitored. Resistors in series with the copper block limited the current to 1.0 mA in the event of a dielectric failure.

FIG. 1 shows the data obtained for multiple points on the sample surface. Clearing events are typically seen as current spikes at a particular voltage. The subsequent drop in current indicates that a defect or void in the coating was evaporated away as a result of the current flow and that the bulk of the dielectric material surface remained intact. After clearing events in the 200-350V range, the dielectric coating was able to withstand up to 800V without current flow indicating a dielectric strength of at least 727 V/micron. The chemical composition of the deposited dielectric material was measured by Rutherford Backscattering and Hydrogen Forward Scattering Spectrometry and was verified to be the same before and after the breakdown test.

Example E

In this example, a roll of aluminum-metallized 6-micron thick polyester polymer film with resistivity of 22 ohm-square was mounted in the vacuum web-handling system of Example C. The chamber was then evacuated and the polyester film was argon ion beam precleaned at a drum speed of 0.5 fpm. An interlayer was deposited prior to the deposition of the main dielectric layer. The deposition condition for the interlayer were 40 sccm Ar, 6 amp of anode current, and 60 V anode-to-ground voltage, the drum speed of 4 fps and the flow rate of OMCTS to be 0.1 g/min. The dielectric layer was deposited under the same conditions as in Example C, except the drum speed was 0.2 µm. The resulting dielectric coating thickness was estimated to be about 0.5 micron based on previous similar deposition runs.

Figure 2:
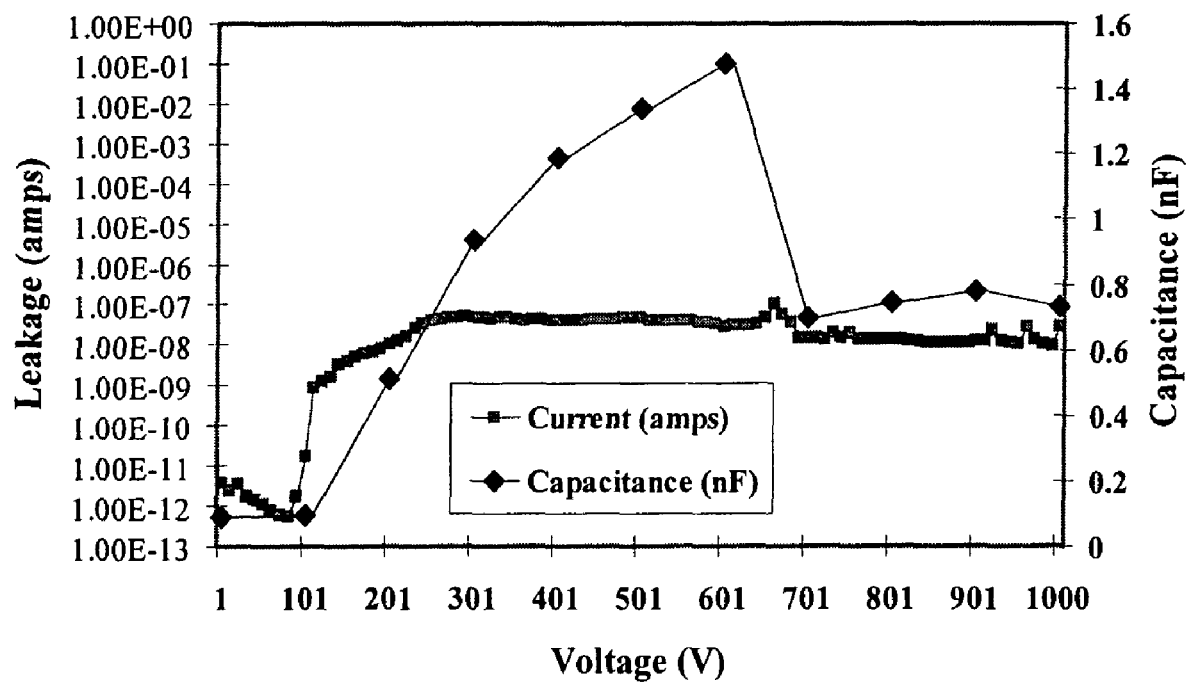
FIG. 2 is a graph showing capacitance test results for a coated substrate according to one embodiment of this invention.

The breakdown voltage and dielectric strength were evaluated using a 6-micron thick PET film with 22 ohms/square of Al metal as the top electrode. A 12 mm-diameter of 25 micron thick polyester film mask was placed between the clearable top electrode and the dielectric film A high voltage power supply was attached to the 22 ohms/square Al top electrode and also to an uncoated margin on the film material which left a portion of the aluminum metallization exposed. The power supply voltage was then increased and the current and capacitance were monitored. As the electrical field increased, electrostatic forces were generated which resulted in excellent contact between the top electrode and the dielectric film. As illustrated in FIG. 2, after clearing events in the 650 V range, the capacitance dropped indicating that the dielectric strength of the coating was 1300 Volts per micron.

Example F

Figure 3:
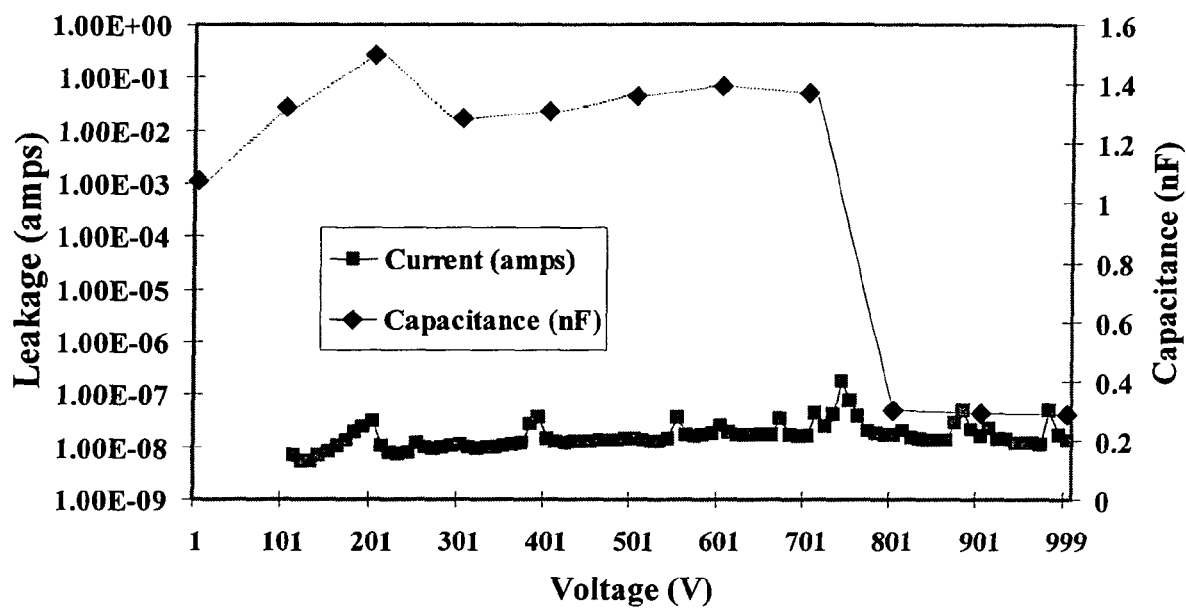
FIG. 3 is a graph showing capacitance test results for a coated substrate according to one embodiment of this invention.

A dielectric coating material on a roll of aluminum-metallized 6-micron thick polyester polymer film was prepared by the same procedure as in Example E, and tested for dielectric strength. In order to eliminate the air gap between the top electrode and the dielectric film, a drop of capacitor grade rapeseed oil was applied. As illustrated in FIG. 3, after clearing events in the 750 V range, the measured capacitance dropped indicating the dielectric strength of the dielectric coating was 1500 volts/micron. Compared to the test in Example E, the replacement of air in the gap between the top electrode and the dielectric film with a higher dielectric constant material, such as an oil, resulted in higher breakdown strength value. The addition of capacitor grade oil is a common practice for packaged wound capacitors. This Example also demonstrated that the dielectric films produced by this invention are stable with rapeseed oil (RSO). In addition, the dielectric material is stable in other capacitor oils such as silicone oil.

Similar processes were used to produce coatings on metallized webs having C: 35±2 atomic %, H: 25±1 atomic %, O: 22±2 atomic %, and Si: 15±1 atomic %.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the claims.

What is claimed is:

1. A method for depositing onto a substrate a dielectric coating material containing one or more of C, H, Si, and O, which comprises:
   (a) mounting a substrate in a deposition vacuum chamber and placing the chamber under vacuum;
   (b) etching the surface of the substrate with energetic ions, chemically reactive species, or a combination of these, thereby providing a cleaned, activated surface;
   (c) depositing onto the cleaned activated surface a layer of dielectric material by exposing the substrate to a deposition flux emitted by precursor gases comprising one or more organo-silicon compounds and oxygen, in the presence of a plasma, using a deposition rate in the range of about 50 to about 5000 Angstroms/second; and
   (d) recovering the substrate coated with a first dielectric layer.

2. The method of claim 1, wherein the oxygen and organosiloxane or organosilazane precursor gases are deposited in the presence of an ion beam.

3. The method of claim 2, wherein the ion beam is generated by a gridless ion source.

4. The method of claim 3, wherein the gridless ion source is selected from the group consisting of End Hall ion sources, Hall current ion sources, and closed-drift ion sources.

5. The method of claim 1, wherein the substrate comprises a polymer, a metal, a glass, a ceramic, or a combination of these.

6. The method of claim 1, further comprising applying a second dielectric layer of different composition from the first dielectric layer.

7. The method of claim 1, wherein the precursor gases further comprise nitrogen.

8. The method of claim 7, wherein the first dielectric layer further comprises nitrogen.

9. The method of claim 1, wherein the precursor gases comprise hexamethyldisiloxane, tetramethylcyclotetrasiloxane, octamethylcyclotetrasiloxane, or mixtures thereof.

10. The method of claim 1, wherein the deposition rate of the first dielectric layer is in the range of about 100 to about 5000 Angstroms/sec.

11. The method of claim 1, using low precursor gas flows relative to high oxygen flows and having a flow ratio of about 0.03 units of precursor gas to units of oxygen.

12. A method for depositing onto a substrate a dielectric coating material containing one or more of C, H, Si, and O, which comprises:
   (a) mounting a substrate in a deposition vacuum chamber and placing the chamber under vacuum;
   (b) etching the surface of the substrate with energetic ions, chemically reactive species, or a combination of these, thereby providing a cleaned, activated surface;
   (c) depositing onto the cleaned activated surface a layer of dielectric material by exposing the substrate to a deposition flux emitted by precursor gases comprising one or more organo-silicon compounds and oxygen, in the presence of a plasma, using a deposition rate in the range of about 50 to about 5000 Angstroms/second; and
   (d) recovering the substrate coated with a first dielectric layer; and
   (e) using the dielectric coated substrate as a capacitor.

* * * * *